United States Patent [19]
Takahashi

[11] Patent Number: 6,097,642
[45] Date of Patent: Aug. 1, 2000

[54] BUS-LINE MIDPOINT HOLDING CIRCUIT FOR HIGH SPEED MEMORY READ OPERATION

[75] Inventor: Hiroyuki Takahashi, Tokyo, Japan

[73] Assignee: NEC Corporation, Tokyo, Japan

[21] Appl. No.: 09/273,559

[22] Filed: Mar. 22, 1999

[30] Foreign Application Priority Data

Mar. 23, 1998 [JP] Japan .................................. 10-074748

[51] Int. Cl.[7] ...................................................... G11C 7/00
[52] U.S. Cl. ................................... 365/189.11; 365/189.05
[58] Field of Search ......................... 365/189.11, 189.05, 365/189.01

[56] References Cited

U.S. PATENT DOCUMENTS

| | | | |
|---|---|---|---|
| 5,729,152 | 3/1998 | Leung et al. | 326/21 |
| 5,751,978 | 5/1998 | Tipple | 710/129 |

*Primary Examiner*—David Nelms
*Assistant Examiner*—Hoal V. Ho
*Attorney, Agent, or Firm*—Sughrue, Mion, Zinn, Macpeak & Seas, PLLC

[57] ABSTRACT

In a memory system, sense amplifiers are connected to a memory cell array for driving a number of read bus lines according to data read from the memory cell array at periodic intervals. A number of midpoint holding circuits are associated respectively with the read bus lines. Each of the midpoint holding circuits comprises a pull-up driver and a pull-down driver connected in series between terminals of high and low voltages, a circuit node between the drivers being connected to the associated bus line, the drivers having a substantially equal threshold voltage. Control circuitry is responsive to a midpoint control pulse for causing one of the drivers to turn on depending on a voltage at the bus line, so that the conducting driver automatically turns off when the bus line attains a midpoint level between the high and low voltages during an interval when the bus line is not driven by the sense amplifiers.

26 Claims, 5 Drawing Sheets

BUS-LINE MIDPOINT HOLDING CIRCUIT FOR HIGH SPEED MEMORY READ OPERATION

BACKGROUND OF THE INVENTION

1. Field of the Invention

The present invention relates generally to peripheral circuits of an array of memory cells, and more specifically to a midpoint holding circuit for holding an associated read bus line at a midpoint between discrete logical levels.

2. Description of the Related Art

For each read bus line of a semiconductor memory array, a midpoint holding circuit is provided for holding the associated bus line at a midpoint potential between high and low logical levels. A prior art midpoint holding circuit includes two CMOS inverters and first and second transistor-implemented switches. The first switch is turned on in response to a midpoint control (MC) pulse to supply the bus line potential so that one of the inverters of the flip-flop develops a midpoint potential. When the midpoint control pulse is deasserted, the second switch is turned on instead of the first to cause the inverters to form a flip-flop to hold the associated bus line at the midpoint potential. If high speed read operation is of primary concern, it is necessary to shorten the period of the midpoint control pulse by using CMOS transistors of the type that can carry large currents. However, this results in an increase in heat generation. Additionally, if the sense amplifiers are enabled before the trailing edge of the MC pulse, one of the CMOS inverters has to carry an additional current produced by the corresponding sense amplifier. If the enable timing of the sense amplifiers is delayed with respect to the end timing of the MC pulse, the potential at each bus line is likely to drift to an indeterminate potential. If this potential differs substantially from that subsequently supplied from the corresponding sense amplifier, a substantial amount of delay would result in a read operation. Another problem is the large "cut-through" current that flows in the CMOS inverters when they are simultaneously turned on in response to the associated bus line reaching the midpoint level.

SUMMARY OF THE INVENTION

It is therefore an object of the present invention to provide, for each read bus line of a memory cell array, a midpoint holding circuit that allows high speed read operation of the memory.

According to the present invention, there is provided a midpoint holding circuit connected to an associated read bus line of a memory, comprising a pull-up driver and a pull-down driver connected in series between terminals of high and low voltages, a circuit node between the drivers being connected to the bus line, the drivers having a substantially equal threshold voltage. Control circuitry is responsive to a midpoint control pulse for causing one of the drivers to turn on depending on a voltage at the bus line, so that the one driver automatically turns off when the bus line attains a midpoint level between the high and low voltages.

In one embodiment of this invention, the control circuitry is arranged to turn on one of the drivers during mutually exclusive times depending on a voltage previously developed at the bus line.

For implementation of simplified configuration, the control circuitry is arranged to simultaneously forward bias the drivers in response to the midpoint control pulse and to turn on one of the forward-biased drivers depending on a voltage occurring at the bus line.

According to a further aspect, the present invention provides a memory system comprising a plurality of sense amplifiers connected to a memory cell array for driving a plurality of read bus lines according to data read from the memory cell array at periodic intervals. A plurality of midpoint holding circuits are associated respectively with the read bus lines. Each of the midpoint holding circuits comprises a pull-up driver and a pull-down driver connected in series between terminals of high and low voltages, a circuit node between the drivers being connected to the associated bus line, the drivers having a substantially equal threshold voltage. Control circuitry is responsive to a midpoint control pulse for causing one of the drivers to turn on depending on a voltage at the bus line, so that the conducting driver automatically turns off when the bus line attains a midpoint level between the high and low voltages during an interval when the bus line is not driven by the sense amplifiers.

BRIEF DESCRIPTION OF THE DRAWINGS

The present invention will be described in further detail with reference to the accompanying drawings, in which.

DETAILED DESCRIPTION

Figure 1:
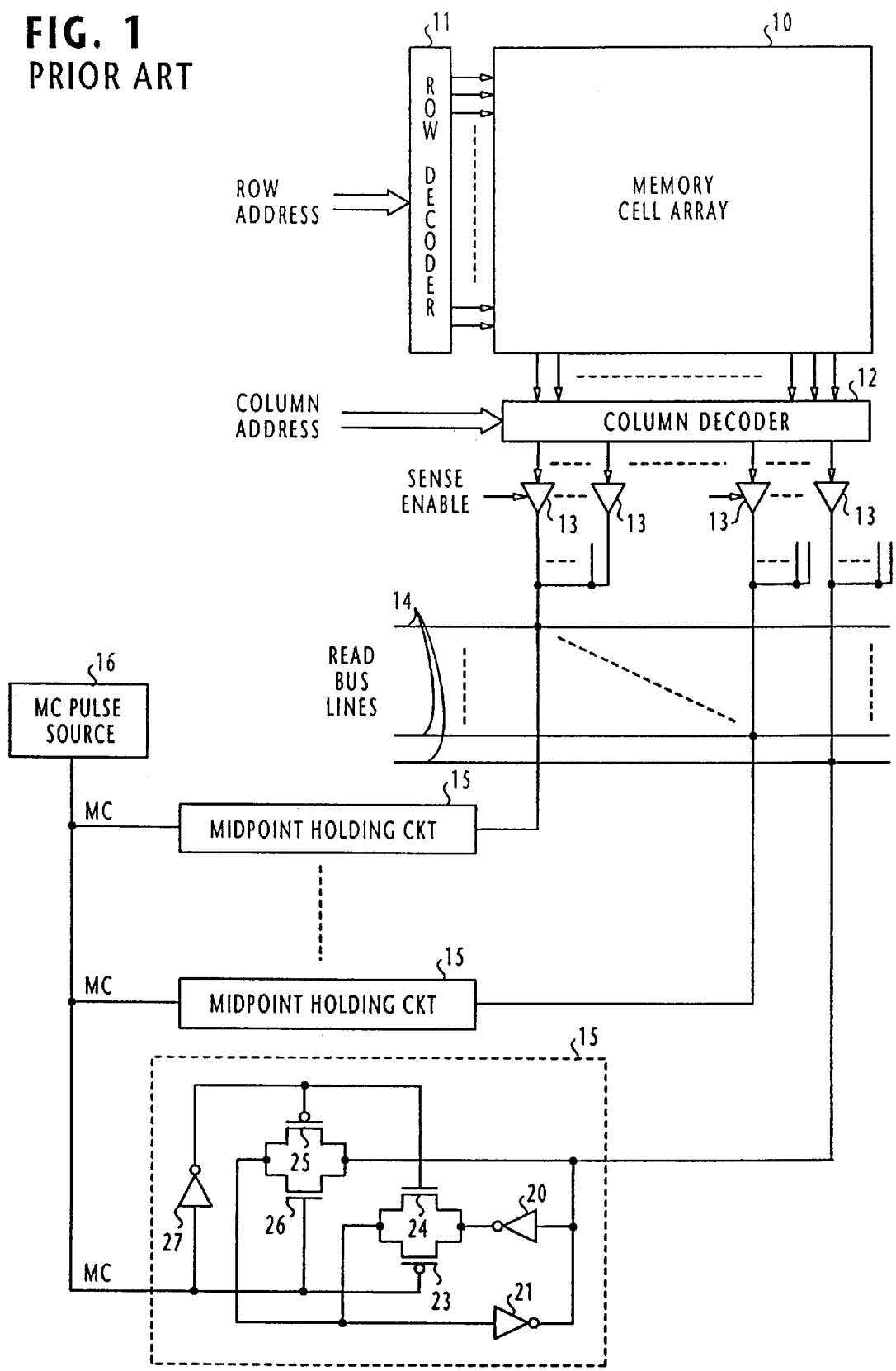
FIG. 1 is a circuit diagram of prior art midpoint holding circuits for a memory cell array.

Before proceeding with the detailed description of the present invention, it may be useful to provide an explanation of the prior art with reference to FIG. 1. Illustrated in FIG. 1 is a memory cell array 10 whose memory cells are individually accessed by a row decoder 11 and a column decoder 12 in a well known manner in response to row and column addresses. Sense amplifiers 13 are connected between the outputs of column decoder 12 and read bus lines 14. One of the sense amplifiers is selected for each bus line and enabled by a sense enable signal (SE) to deliver amplified outputs of column decoder 12 to respective read bus lines 14. A plurality of midpoint holding circuits 15 of identical configuration are connected to the respective bus lines 14.

Each midpoint holding circuit 15 is arranged to receive a midpoint control pulse (MC) from a pulse source 16. This circuit is comprised of CMOS (complementary metal oxide semiconductor) inverters 20 and 21, the output of inverter 20 being connected to the input of inverter 21 via a first switch that is formed by a PMOS (p-channel metal oxide semiconductor) transistor 23 and an NMOS (n-channel metal oxide semiconductor) transistor 24 which are turned on when the MC input is low. A second switch is formed by a PMOS transistor 25 and an NMOS transistor 26, the second switch being turned on when the first switch is turned off and turned off when the first switch is turned on. An inverter 27 is provided to reverse the state of the MC input at the gates of transistors 24 and 25.

When no voltages are delivered to the bus from the sense amplifiers 13, the first-switch transistors 23 and 24 are turned on, coupling the inverters 21 and 22 in a loop to present a flip-flop to the associated bus line so that its potential is prevented from floating between logical levels.

When the MC input from pulse source 16 is asserted high before the sense amplifiers 13 are subsequently enabled, the first-switch transistors 23 and 24 are turned off and the second-switch transistors 25 and 26 are turned on. As a result, the potential at the bus line 14 is supplied to the input of inverter 21 through the parallel paths of transistors 23, 24. If this bus line potential is low, the PMOS transistor of inverter 21 turns on, and if it is high, the NMOS transistor of inverter 21 is driven into a state of high conductivity. As a result, the bus line potential drifts from the low or high potential level to a midpoint level between the maximum Vcc voltage and ground potential.

When the MC input is deasserted low, i.e., switched to low logic level, the second-switch transistors 25 and 26 are turned off and the first-switch transistors 23 and 24 are turned on instead. Inverters 20 and 21 are thus brought into a loop, forming the above-mentioned flip-flop and the midpoint potential developed by the inverter 21 is stored in the flip-flop. When the sense amplifiers 13 are enabled, each of the bus lines 14 changes from the midpoint potential to a higher or a lower potential depending on data delivered from the corresponding sense amplifier.

However, since the bus lines have a high loading impedance, the inverters 20 and 21 must be implemented with transistors of low impedance for carrying large currents. If high speed read operation is of primary concern, it is necessary to shorten the period of the MC pulse by using CMOS transistors of the type that can carry still larger currents. However, this results in an increase in heat generation. Additionally, if the sense amplifiers are enabled before the trailing edge of the MC pulse, the inverter 21 of each midpoint holding circuit has to carry an additional current produced by the corresponding sense amplifier. If the enable timing of the sense amplifiers is delayed with respect to the end timing of the MC pulse, the potential at each bus line is likely to drift to an indeterminate potential. If this potential differs substantially from that subsequently supplied from the corresponding sense amplifier, a substantial amount of delay would result in a read operation. In addition, when the bus line potential reaches the midpoint level, the transistors of the inverter 21 are simultaneously brought into the ON state. This causes a large "cut-through" current through the conducting transistors.

The present invention solves these problems by the use of a pull-up driver and a pull-down driver connected in a series circuit between two predetermined voltages, with a circuit node between them being connected to an associated bus line.

Figure 2:
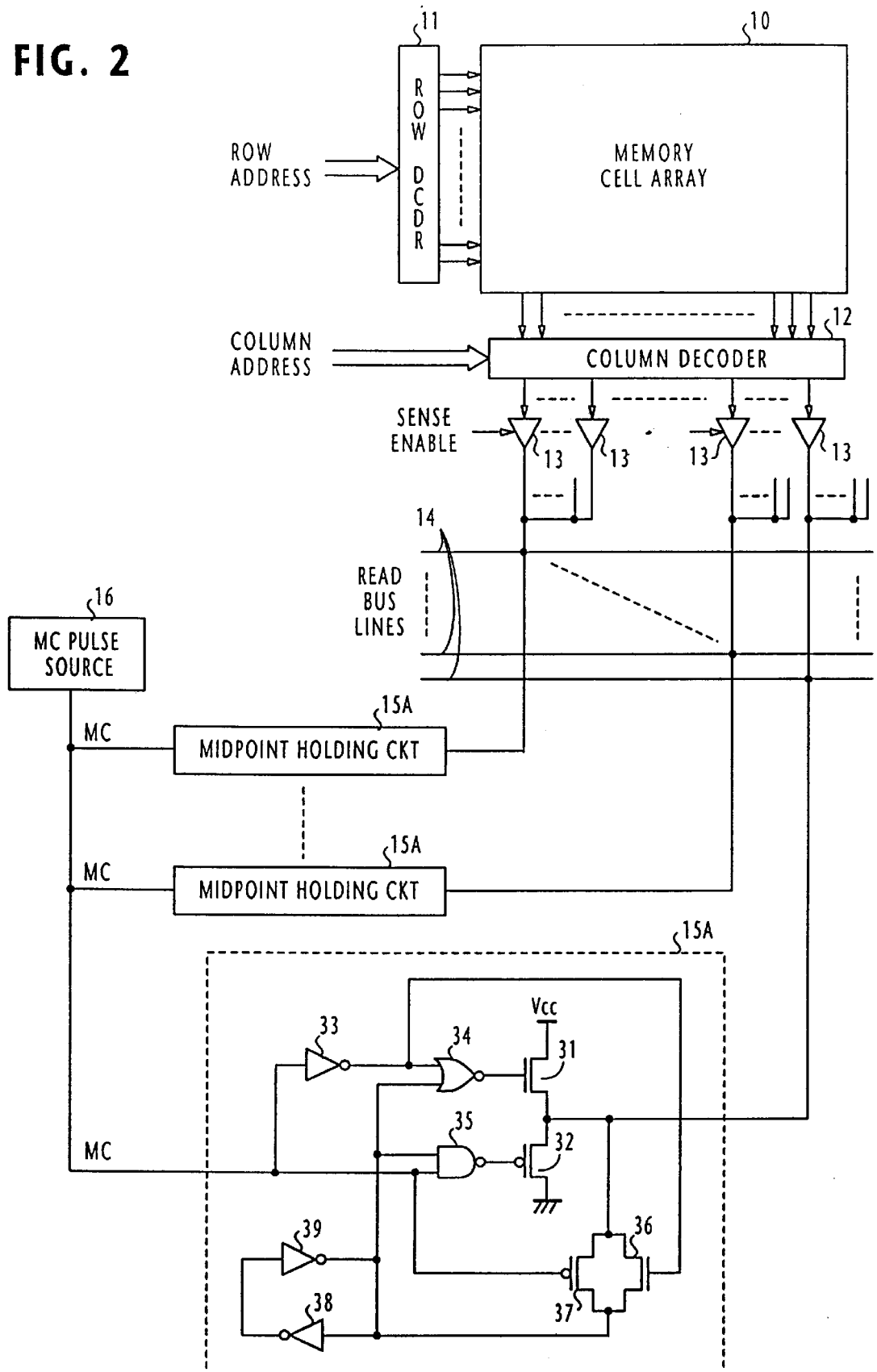
FIG. 2 is a circuit diagram of midpoint holding circuits according to a first embodiment of the present invention.

A first embodiment of this invention is shown in FIG. 2. A midpoint holding circuit 15A is comprised of an NMOS pull-up transistor (driver) 31 and a PMOS pull-down transistor (driver) 32 with their drain electrodes connected respectively to the Vcc voltage terminal and ground and their source electrodes being coupled together to the associated bus line.

The MC input is applied to the gate of pull-up driver 31 via an inverter 33 and a NOR gate 34 and applied to the gate of pull-down driver 32 via a NAND gate 35. The associated bus line is coupled to a switch formed by parallel-connected NMOS transistor 36 and a PMOS transistor 37. The gates of transistors 36 and 37 are respectively connected to the output of inverter 33 and the MC input so that the switch is turned on when the MC input is low for coupling the bus line potential to the NOR gate 34 and NAND gate 35 and is turned off when the MC input is asserted high. CMOS inverters 38 and 39 is provided to form a flip-flop for receiving the bus line potential via the parallel transistors 36 and 37.

When the MC input is low before the sense amplifiers are enabled, the transistors 36 and 37 are turned on and a potential remaining on the bus line is passed through these transistors and latched in the flip-flop inverters 38 and 39. Regardless of this stored potential level, the NOR gate 34 asserts a zero-volt potential to the gate of pull-up transistor 31 as indicated by numeral 40 in FIG. 3, and the NAND gate 35 asserts a high voltage (Vcc) to the gate of pull-down transistor 32 as indicated by numeral 45. Therefore, when the MC input is low, both pull-up and pull-down transistors 31 and 32 are set in the OFF state, regardless of the voltage at the bus line.

When the MC input is asserted high, one of the pull-up and pull-down transistors 31 and 32 is switched to an ON state depending on the previous bus line potential stored in the flip-flop inverters 38 and 39.

Assuming that the stored bus line potential is low, the NOR gate 34 is activated, producing a high voltage output 41 (FIG. 3) and the NAND gate 35 is still activated, continuing to produce the high voltage output. As a result, only the pull-up transistor 31 is turned on, causing the bus line potential to increase as indicated by numeral 42 in FIG. 3. As the bus line potential increases, the potential at the gate of pull-up transistor 31 decreases. Transistor 31 thus turns off when its gate potential equals $Vcc-V_{tn}$, where $V_{tn}$ is the threshold voltage of the transistor 31. Therefore, the bus line voltage increases gradually from the zero-volt potential to a midpoint level and thereafter the bus line is held at this level and the source of transistor 31 is "floating" as long as the MC input is high.

If the threshold voltage $V_{tn}$ of the NMOS transistor 31 is of the nominal value of 0.7 volts, it increases to 1.2 volts due to its backward biasing effect because of the floating condition of its source electrode (i.e., equivalent to a situation in which the well potential is lowered below the source voltage). Since $V_{tn}$ is 1.2 volts, if the Vcc voltage is 2.5 volts, the bus line settles on a midpoint voltage equal to approximately 1.2 volts.

Figure 3:
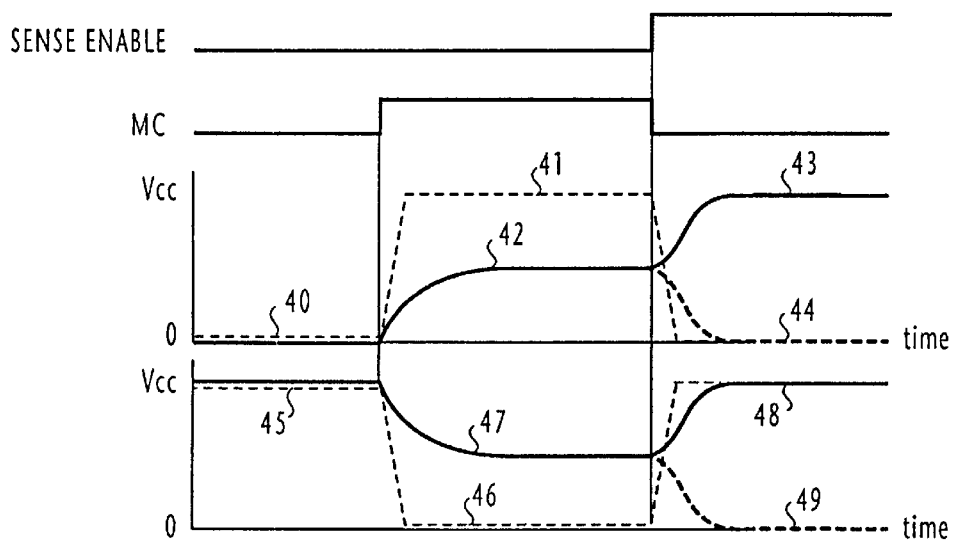
FIG. 3 shows waveforms of the voltages on the associated bus line depending on previous voltage levels and potentials that appear in the midpoint holding circuit of FIG. 2 in response to a midpoint control pulse.

Since the switching transistors 36 and 37 are in the OFF state as long as the MC input is high, the flip-flop inverters 38, 39 and the NOR gate 34 are not affected by the bus line potential variation 42 (FIG. 3). At the instant the MC input is deasserted low, the corresponding sense amplifier is enabled. The bus line potential moves from the midpoint level 42 and quickly settles on a high potential 43 or a low potential 44, depending on the logical state of the enabled sense amplifier.

On the other hand, if the stored bus line potential is high at the instant the MC input is asserted high, the NAND gate 35 is activated, producing a low voltage output 46 (FIG. 3) and the NOR gate 34 is deactivated, producing a low voltage output. As a result, only the pull-down PMOS transistor 32 is turned on, causing the bus line potential to decrease as indicated by a curve 47. As the bus line potential decreases until it reaches the threshold voltage $V_{tp}$ of the pull-down transistor 32, the bus line voltage decreases gradually from the Vcc potential to the midpoint level and thereafter the bus line is held at this level.

The turn-off of switching transistors 36 and 37 when the MC input is being asserted prevents the flip-flop inverters 38, 39 and the NAND gate 35 from being affected by the bus line potential variation 47 (FIG. 3). When the MC input is deasserted low and the corresponding sense amplifier is enabled, the bus line potential moves from the midpoint level 47 and quickly settles on a high potential 48 or a low potential 49, depending on the logical state of the enabled sense amplifier.

Since the pull-up and pull-down transistors are arranged to be biased in opposite sense to each other, only one of these transistors is turned on during mutually exclusive times. Therefore, there is no likelihood whatsoever of these transistors being turned on simultaneously.

When the MC input is deasserted low, the bus line tends to "float". However, since the flip-flop inverters 38 and 39 can be implemented with low power rating transistors and since the bus line has a large time constant, no potential variation occurs on the bus line even if the enable timing of a ii selected sense amplifier is delayed with respect to the trailing edge of the MC input pulse.

Although this embodiment is useful for any application, it is particularly useful for applications where the Vcc voltage is relatively high.

Figure 4:
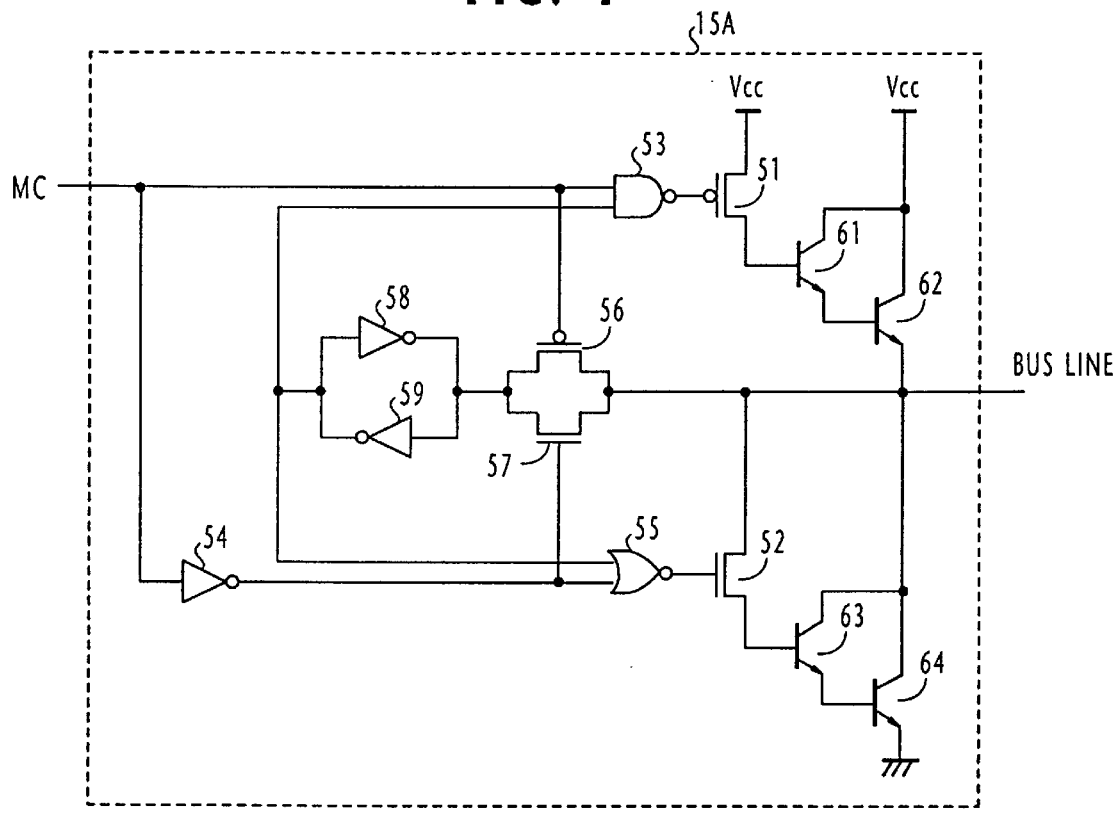
FIG. 4 is a circuit diagram of a modification of the first embodiment, using a pair of Darlington amplifiers.

The midpoint holding circuit 15A of FIG. 2 is modified and shown in FIG. 4. The modified midpoint holding circuit has a pull-up transistor 51 which is implemented with a PMOS transistor and a pull-down transistor 52 implemented with an NMOS transistor. In this embodiment, the pull-up transistor 51 has its source connected to the voltage Vcc and the pull-down transistor 52 has its source connected to the associated bus line.

The MC input is connected to a NAND gate 53 and a complementary level of the MC input is produced by an inverter 54 and supplied to a NOR gate 55. Switching transistors 56 and 57 of PMOS and NMOS types, respectively, are provided to respond to the true and complementary MC inputs for establishing a path from the bus line to a flip-flop formed by CMOS inverters 58 and 59. The output of the flip-flop is supplied to the NAND gate 53 and NOR gate 55. The logic operation of the portion of the circuit that controls the transistors 51 and 52 is basically similar to that shown in FIG. 2.

This modification is characterized by bipolar transistors 61 and 62 forming a first Darlington amplifier and bipolar transistors 63 and 64 forming a second Darlington amplifier in order to take advantage of their extremely high forward current transfer ratio. The base of transistor 61 of the first Darlington amplifier is connected to the drain of transistor 51 and the emitter of transistor 62 is connected to the bus line, with the collectors of transistors 61 and 62 being connected together to the Vcc voltage terminal. In the case of the second Darlington amplifier, the base of transistor 63 is connected to the drain of transistor 52 and the emitter of transistor 64 is connected to ground and the collectors of transistors 63 and 64 are connected together to the bus line.

Because of the high forward current transfer ratio of the Darlington amplifiers, the midpoint bus drive operation can be speeded up. When data stored in the flip-flop inverters 58 and 59 is high, the NAND gate 53 asserts a low-level output in response to the high-level MC input pulse. The pull-up PMOS transistor 51 thus turns on and remains in the ON state until the bus line potential is pulled up to a level $Vcc-2V_{f1}$ (where $V_{f1}$ is the emitter-to-base potential difference of the bipolar transistors 61 and 62). When the data stored in the flip-flop inverters 58 and 59 is low, the NOR gate 55 asserts a high-level output in response to the complementary MC input from the inverter 54. Thus, the pull-down NMOS transistor 52 turns on and remains in the ON state until the bus line potential is pulled down to a level $2V_{f2}$ (where $V_{f2}$ is the emitter-to-base potential difference of the bipolar transistors 63 and 64). Since $V_{f1}$ and $V_{f2}$ are usually in the range between 0.6 and 0.7 volts, the bus line voltage attains the midpoint level of about 1.2 volts.

Figure 5:
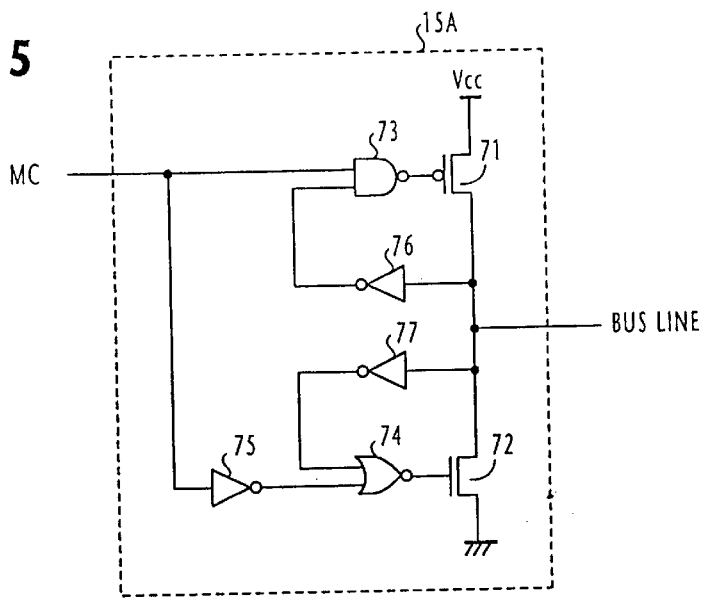
FIG. 5 is a circuit diagram of a further modification of the first embodiment, using inverters of different thresholds.

The midpoint holding circuit 15A can be simplified as shown in FIG. 5. In this modification, the pull-up and pull-down drivers are respectively implemented with a PMOS transistor 71 and an NMOS transistor 72, with the gates of transistors 71 and 72 being respectively driven by a NAND gate 73 and a NOR gate 74. Instead of the switching transistors and flip-flop inverters of FIG. 2, inverters 76 and 77 with different threshold voltages are connected to the associated bus line to form respective feedback paths to the gates of transistors 71 and 72 with the NAND gate 73 and NOR gate 74. The MC input is directly supplied to the NAND gate 73 and a complementary level of the MC input is provided by an inverter 75 to the NOR gate 74. The threshold voltage of inverter 76 is slightly lower than the midpoint level (½ of the voltage Vcc), while the threshold voltage of inverter 77 is slightly higher than the midpoint level.

Figure 6:
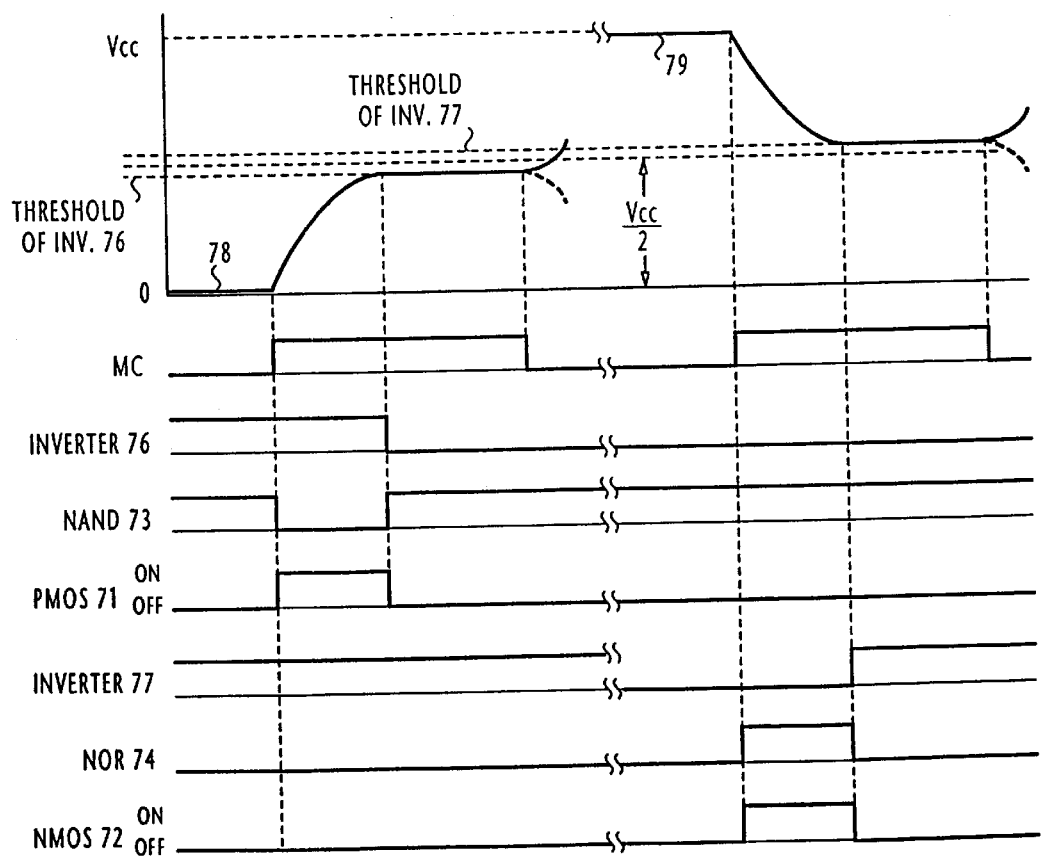
FIG. 6 shows waveforms of bus line voltages and various signals that appear in FIG. 5.

As illustrated in FIG. 6, the inverter 76 is the one that is earlier to sense that a previous low bus-line voltage has raised to its threshold and produces a low-level output, while the inverter 77 is earlier to sense that a previous high bus-line voltage has lowered to its threshold and produces a high-level output.

If the previous bus-line voltage is low during the time the MC input is low, as indicated by a curve 78 in FIG. 6, the inverter 76 is producing a high-level output, causing the NAND gate 73 to maintain its output at a high level. Pull-up PMOS transistor 71 is therefore held in the OFF state. On the other hand, the inverter 77 is asserting high, causing the NOR gate 74 to maintain its output at a low level.

When the MC input is subsequently asserted high, the NAND gate 73 responds to this change so that its output changes to low level which drives the pull-up transistor 71 into the ON state. As a result, the low-level bus line voltage is pulled up until it reaches the threshold voltage of inverter 76. When this occurs, the inverter 76 switches to low, causing the NAND gate 73 to go high to terminate the ON state of the pull-up transistor 71. The bus line voltage is thus maintained at a point close to the midpoint voltage until the bus line is subsequently driven to high or low level according to the output of the corresponding sense amplifier.

If the previous bus-line voltage is high during the time the MC input is low, as indicated by a curve 79 in FIG. 6, the inverter 77 is producing a low-level output, causing the NOR gate 74 to maintain its output at a low level. Pull-down NMOS transistor 72 is therefore held in the OFF state. On the other hand, the inverter 76 is asserting low, causing the NAND gate 73 to maintain its output at a high level.

When the MC input is subsequently asserted high, the NOR gate 74 responds to this change so that it produces a high level output, which drives the pull-down transistor 72 into the ON state. As a result, the high-level bus line voltage is pulled down until it reaches the threshold voltage of inverter 77. When this occurs, the inverter 77 switches to high, causing the NOR gate 74 to go low to terminate the ON state of the pull-down transistor 72. The bus line voltage is thus maintained at a point close to the midpoint voltage until the bus line is subsequently driven to high or low level according to the output of the corresponding sense amplifier.

Figure 7:
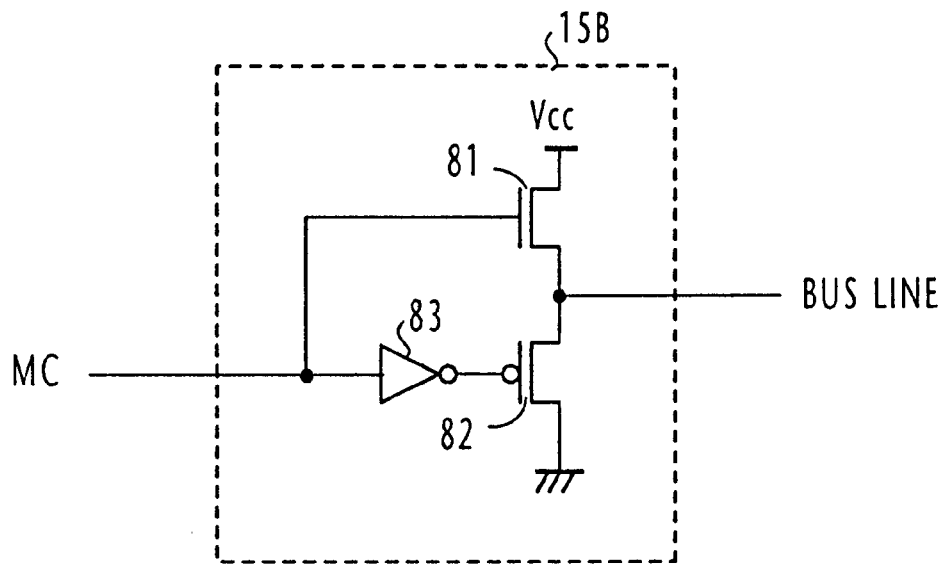
FIG. 7 is a circuit diagram of the midpoint holding circuit according to a second embodiment of the present invention.

A second embodiment of the midpoint holding circuit is shown in FIG. 7, which is a simplified implementation of the previous embodiment. The midpoint holding circuit 15B comprises an NMOS pull-up transistor 81 and a PMOS pull-down transistor 82, with the drain of transistor 81 being connected to the terminal of highest voltage Vcc and the drain of transistor 82 connected to the terminal of lowest voltage, or ground potential. The source electrodes of transistors 81 and 82 are connected together to the associated bus line. Both of these transistors 81 and 82 have the same threshold voltage.

In the second embodiment, the gate of pull-up transistor 81 directly receives the MC input, while the gate of pull-down transistor 82 receives a complementary level of the MC input via an inverter 83. With this arrangement, when the MC input is low, both pull-up and pull-down transistors 81 and 82 are in the OFF state, and when the MC input is asserted high, they are simultaneously forward-biased. However, only one of the forward-biased transistors is turned on, which is determined by the potential level of the associated bus line at the instant the MC input is asserted high.

Specifically, if the bus line potential is low when the MC input is asserted high, only the pull-up transistor 81 is turned on, and the bus line potential is pulled up to a level $Vcc-V_{tn}$, where $V_{tn}$ is the threshold voltage of the transistor 81. If the bus line potential is high when the MC input is asserted high, only the pull-down PMOS transistor 82 is turned on and the bus line potential is pulled down to the threshold voltage $V_{tp}$ of the transistor 82. Since $V_{tn}$ is equal to $V_{tp}$ and $Vcc-V_{tn}= V_{tp}$, the bus line voltage is held at a midpoint level (1.2 volts) between Vcc and ground potential.

Due to variability of threshold voltages, there is a possibility that the PMOS and NMOS transistors 81 and 82 concurrently turn on, producing a relatively large current from Vcc to ground. Therefore, this embodiment is particularly useful for applications where the Vcc voltage is relatively low.

Figure 8:
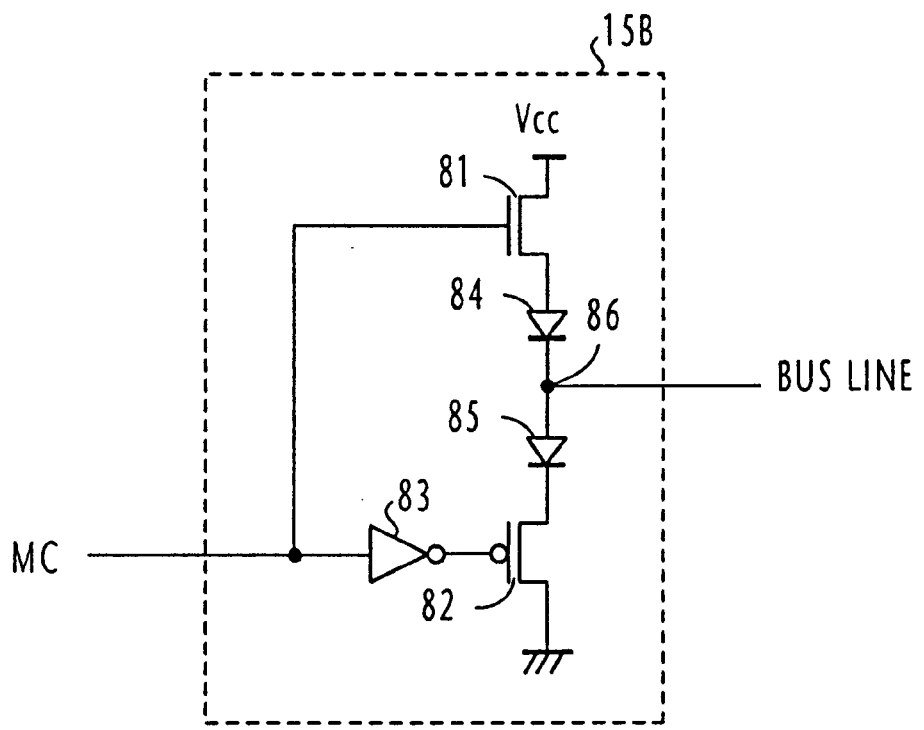
FIG. 8 is a circuit diagram of a modification of the second embodiment.

The embodiment of FIG. 7 is modified as shown in FIG. 8 in which a first diode 84 is connected between the source of pull-up transistor 81 and the circuit node 86 and a second diode 85 between the circuit node 86 and the source of pull-down transistor 82. In the case of diode 84, the direction of conduction is to allow current to flow from the pull-up transistor 81 to the bus line, and in the case of diode 85 the direction of conduction is to allow current to flow from the bus line to the pull-down transistor 82.

When the pull-up NMOS transistor 81 is in the ON state, i.e., the bus line potential is low when the MC input is asserted high, the maximum bus line potential that can be attained is equal to $Vcc-V_{tn}-V_{f1}$, where $V_{f1}$ is the forward biasing voltage of diode 84. When the pull-down PMOS transistor 82 is in the ON state, i.e., the bus line potential is high when the MC input is asserted high, the attainable bus line potential is equal to $V_{tp}+V_{f2}$, where $V_{f2}$ is the forward biasing voltage of diode 85 and equals $V_{f1}$.

This diode arrangement of FIG. 6 prevents the bus line potential from deviating from the desired midpoint potential, which would otherwise occur as a result of possible variability of the threshold voltages of CMOS transistors.

The present invention can be summarized as follows. Since the pull-up and pull-down drivers of all embodiments are not simultaneously turned on, there is no cut-through current that would otherwise waste energy. When the associated bus line attains the midpoint potential, the driving transistor automatically turns off and waits in a floating condition for an output voltage from the corresponding sense amplifier. Therefore, the present invention eliminates the need to provide precision timing adjustment of the duration of the midpoint control pulse as well as the need to provide precision timing adjustment between the trailing edge of each midpoint control pulse and the leading edge of the subsequent sense enable pulse. As a result, high speed read operation is achieved.

What is claimed is:

1. A midpoint holding circuit connected to an associated read bus line of a memory, comprising:

a pull-up driver and a pull-down driver connected in series between terminals of high and low voltages, a circuit node between said drivers being connected to the bus line, said drivers having a substantially equal threshold voltage; and control circuitry responsive to a midpoint control pulse for causing one of said drivers to turn on depending on a voltage subsequently developed at said bus line, so that said one driver automatically turns off when said bus line attains a midpoint level between said high and low voltages.

2. A midpoint holding circuit as claimed in claim 1, wherein said control circuitry is arranged to turn on one of said drivers during mutually exclusive times depending on a voltage previously developed at said bus line.

3. A midpoint holding circuit as claimed in claim 2, wherein said control circuitry comprises:

a switch responsive to said midpoint control pulse for establishing a path to said bus line;

a latching circuit connected to said switch for storing a voltage supplied from said bus line through the established path; and a logic gate circuit responsive to said midpoint control pulse for turning on one of said drivers depending on the voltage stored in said latching circuit.

4. A midpoint holding circuit as claimed in claim 3, wherein said logic gate circuit comprises:

a first coincidence circuit simultaneously responsive to a true value of the midpoint control pulse and a true value of the stored voltage of said latching circuit for driving said pull-up driver; and a second coincidence circuit simultaneously responsive to a complementary value of the midpoint control pulse and a complementary value of the stored voltage of said latching circuit for driving said pull-down driver.

5. A midpoint holding circuit as claimed in claim 1, further comprising a first bipolar transistor amplifier connected between said pull-up driver and said bus line and a second bipolar transistor amplifier connected between said pull-down driver and one of said terminals.

6. A midpoint holding circuit as claimed in claim 5, wherein said each of said first and second bipolar transistor amplifiers comprises a Darlington amplifier.

7. A midpoint holding circuit as claimed in claim 1, wherein said control circuitry comprises:

a first inverter having a first threshold voltage lower than said midpoint level and a second inverter having a second threshold voltage higher than said midpoint level, each of said inverters having an input connected to said bus line to change state when voltage at said bus line reaches the threshold voltage of the inverter; and a logic gate circuit responsive to said midpoint control pulse for activating one of said drivers according to a voltage output from one of said inverters.

8. A midpoint holding circuit as claimed in claim 1, wherein said pull-up driver comprises an n-channel metal oxide semiconductor transistor and said pull-down driver comprises a p-channel metal oxide semiconductor transistor, each of said transistors having a threshold voltage substantially equal to said midpoint level.

9. A midpoint holding circuit as claimed in claim 1, wherein said pull-up driver comprises a p-channel metal oxide semiconductor transistor and said pull-down driver comprises an n-channel metal oxide semiconductor transistor, each of said transistors having a threshold voltage substantially equal to said midpoint level.

10. A midpoint holding circuit as claimed in claim 1, wherein said control circuitry is arranged to simultaneously forward bias said drivers in response to said midpoint control pulse and to activate one of the forward-biased drivers according to a voltage currently developed at said bus line.

11. A midpoint holding circuit as claimed in claim 10, wherein said control circuitry comprises means for activating the pull-up driver with a true level of the midpoint control pulse and an inverter for activating the pull-down driver with a complementary level of the midpoint control pulse.

12. A midpoint holding circuit as claimed in claim 10, further comprising a first diode connected between said pull-up driver and said bus line in a forward-biasing direction of the first diode and a second diode connected between said bus line and said pull-down driver in a forward-biasing direction of the second diode.

13. A midpoint holding circuit as claimed in claim 10, wherein said pull-up driver comprises an n-channel metal oxide semiconductor transistor and said pull-down driver comprises a p-channel metal oxide semiconductor transistor, each of said transistors having a threshold voltage substantially equal to said midpoint level.

14. A memory system comprising:
   a plurality of sense amplifiers connected to a memory cell array for driving a plurality of read bus lines according to data read from the memory cell array at periodic intervals;
   a plurality of midpoint holding circuits associated respectively with said read bus lines;
   each of said midpoint holding circuits comprising:
      a pull-up driver and a pull-down driver connected in series between terminals of high and low voltages, a circuit node between said drivers being connected to the associated bus line, said drivers having a substantially equal threshold voltage; and
      control circuitry responsive to a midpoint control pulse for causing one of said drivers to turn on depending on a voltage subsequently developed at said bus line, so that said one driver automatically turns off when said bus line attains a midpoint level between said high and low voltages during an interval when said bus line is not driven by said sense amplifiers.

15. A memory system as claimed in claim 14, wherein said control circuitry is arranged to turn on one of said drivers during mutually exclusive times depending on a voltage previously developed at said bus line.

16. A memory system as claimed in claim 15, wherein said control circuitry comprises:
   a switch responsive to said midpoint control pulse for establishing a path to said bus line;
   a latching circuit connected to said switch for storing a voltage supplied from said bus line through the established path; and
   a logic gate circuit responsive to said midpoint control pulse for turning on one of said drivers depending on the voltage stored in said latching circuit.

17. A memory system as claimed in claim 16, wherein said logic gate circuit comprises:
   a first coincidence circuit simultaneously responsive to a true value of the midpoint control pulse and a true value of the stored volt age of said latching circuit for driving said pull-up driver; and
   a second coincidence circuit simultaneously responsive to a complementary value of the midpoint control pulse and a complementary value of the stored voltage of said latching circuit for driving said pull-down driver.

18. A memory system as claimed in claim 14, further comprising a first bipolar transistor amplifier connected between said pull-up driver and said bus line and a second bipolar transistor amplifier connected between said pull-down driver and one of said terminals.

19. A memory system as claimed in claim 18, wherein said each of said first and second bipolar transistor amplifiers comprises a Darlington amplifier.

20. A memory system as claimed in claim 14, wherein said control circuitry comprises:
   a first inverter having a first threshold voltage lower than said midpoint level and a second inverter having a second threshold voltage higher than said midpoint level, each of said inverters having an input connected to said bus line to change state when voltage at said bus line reaches the threshold voltage of the inverter; and
   a logic gate circuit responsive to said midpoint control pulse for activating one of said drivers according to a voltage output from one of said inverters.

21. A memory system as claimed in claim 14, wherein said pull-up driver comprises an n-channel metal oxide semiconductor transistor and said pull-down driver comprises a p-channel metal oxide semiconductor transistor, each of said transistors having a threshold voltage substantially equal to said midpoint level.

22. A memory system as claimed in claim 14, wherein said pull-up driver comprises a p-channel metal oxide semiconductor transistor and said pull-down driver comprises an n-channel metal oxide semiconductor transistor, each of said transistors having a threshold voltage substantially equal to said midpoint level.

23. A memory system as claimed in claim 14, wherein said control circuitry is arranged to simultaneously forward bias said drivers in response to said midpoint control pulse and to activate one of the forward-biased drivers according to a voltage currently developed at said bus line.

24. A memory system as claimed in claim 23, wherein said control circuitry comprises means for activating the pull-up driver with a true level of the midpoint control pulse and an inverter for activating the pull-down driver with a complementary level of the midpoint control pulse.

25. A memory system as claimed in claim 23, further comprising a first diode connected between said pull-up driver and said bus line in a forward-biasing direction of the first diode and a second diode connected between said bus line and said pull-down driver in a forward-biasing direction of the second diode.

26. A memory system as claimed in claim 23, wherein said pull-up driver comprises an n-channel metal oxide semiconductor transistor and said pull-down driver comprises a p-channel metal oxide semiconductor transistor, each of said transistors having a threshold voltage substantially equal to said midpoint level.

* * * * *